United States Patent
Konno et al.

(10) Patent No.: US 7,882,477 B2
(45) Date of Patent: Feb. 1, 2011

(54) METHOD AND APPARATUS FOR CREATING LAYOUT MODEL, COMPUTER PRODUCT, AND METHOD OF MANUFACTURING DEVICE

(75) Inventors: Eiichi Konno, Kawasaki (JP); Takao Yamaguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 450 days.

(21) Appl. No.: 11/698,854

(22) Filed: Jan. 29, 2007

(65) Prior Publication Data
US 2008/0082945 A1 Apr. 3, 2008

(30) Foreign Application Priority Data
Sep. 28, 2006 (JP) .............................. 2006-265883

(51) Int. Cl.
G06F 17/50 (2006.01)
(52) U.S. Cl. .................................................. 716/11
(58) Field of Classification Search ............... 716/1–18; 703/2; 361/748–804; 700/98; 345/419–421
See application file for complete search history.

(56) References Cited
U.S. PATENT DOCUMENTS
6,071,315 A * 6/2000 Ramamurthi et al. ......... 716/19

2002/0046387 A1 * 4/2002 Matsushita et al. ............ 716/1

FOREIGN PATENT DOCUMENTS

| JP | 05-324762 | 12/1993 |
|----|-----------|---------|
| JP | 08-087529 | 4/1996 |
| JP | 10-190172 | 7/1998 |
| JP | 11-353341 | 12/1999 |
| JP | 2002-099577 A | 4/2002 |

OTHER PUBLICATIONS

Japan Patent Office; Office Action mailed Aug. 17, 2010, in connection with correspondent JP Patent Application No. 2006-265883, English language translation provided.

* cited by examiner

Primary Examiner—Vuthe Siek
Assistant Examiner—Aric Lin
(74) Attorney, Agent, or Firm—Fujitsu Patent Center

(57) ABSTRACT

A layout-model creating apparatus creates a layout-model for a mechanical computer-aided design from component information including heights and layout information of components created by an electrical computer-aided design. A height determining unit determines whether a height of a component is equal to or lower than a specified height. A three-dimensional-model creating unit creates a three-dimensional model by excluding a component of which the height is determined to be equal to or lower than the specified height.

6 Claims, 12 Drawing Sheets

METHOD AND APPARATUS FOR CREATING LAYOUT MODEL, COMPUTER PRODUCT, AND METHOD OF MANUFACTURING DEVICE

CROSS REFERENCE TO RELATED APPLICATION

This application claims the benefit under 35 U.S.C. Section 119, of Japanese Patent Application No. 2006-265883, filed Sep. 28, 2006, which is hereby incorporated by reference in its entirety into this application.

BACKGROUND OF THE INVENTION

1. Field of the Invention

The present invention relates to a technology for creating a layout model for a mechanical computer-aided design (CAD) from component information created by an electrical CAD including heights and layout information of components, and for manufacturing a device for which a design is supported by an interlock of the electrical CAD and the mechanical CAD.

2. Description of the Related Art

Recently, electrical designing with an electrical CAD and mechanical designing with a mechanical CAD has been performed in parallel in designing of the information processing devices. The electrical designing includes designing of a circuit on a printed board, and the mechanical designing includes designing of a shape of a housing and a layout of components.

It is possible to perform the electric designing and the mechanical designing in parallel. However, a shape of a housing, for example, can put a restriction on a shape or layout of an electrical component. Therefore, information on a design with regard to the electrical designing and the mechanical design is repeatedly exchanged, as the design has progressed. To address the needs, it has been developed a system that aids the electrical CAD and the mechanical CAD to interlock with a capability of facilitating an exchange of information required in the electrical designing and the mechanical designing. For example, Japanese Patent Application Laid-Open No. H11-353341 describes a three-dimensional-model creating device that aids in an interference check by the mechanical CAD by replacing information on a component shape included in the information on the electrical designing with information on a component shape in three-dimensional.

However, because the above three-dimensional-model creating device creates a three-dimensional model from information created by the electrical CAD without any process, it is hard to use the created three-dimensional model in the mechanical CAD.

For example, because most mechanical CADs have different coordinate systems from the electrical CADs, the mechanical CAD is required to transform coordinates of components of the three-dimensional model created by the electrical CAD. The number of components in the three-dimensional model created by the electrical CAD is so large that a processing speed in the mechanical CAD could become lower. Although the mechanical designing should be performed depending on insulation properties of the electrical components, the mechanical designing is performed not depending on the insulation properties because of lack of information on the insulation properties.

SUMMARY OF THE INVENTION

It is an object of the present invention to at least solve the problems in the conventional technology.

An apparatus according to one aspect of the present invention is for creating a layout-model for a mechanical computer-aided design from component information including heights and layout information of components created by an electrical computer-aided design. The apparatus includes a height determining unit that determines whether a height of a component is equal to or lower than a specified height; and a three-dimensional-model creating unit that creates a three-dimensional model by excluding a component of which the height is determined to be equal to or lower than the specified height.

An apparatus according to another aspect of the present invention is for creating a layout-model for a mechanical computer-aided design from component information including heights, attributions of top surfaces, and layout information of components created by an electrical computer-aided design. The apparatus includes an attribution determining unit that determines whether an attribution of a top surface of a component is a predetermined attribution value; and a three-dimensional-model creating unit that creates a three-dimensional model by adding a predetermined value to a height of a component of which the attribute of the top surface is determined to be the predetermined attribution value.

An apparatus according to still another aspect of the present invention is for creating a layout-model for a mechanical computer-aided design from component information including attributions of top surfaces and layout information of components created by an electrical computer-aided design. The apparatus includes an attribution determining unit that determines whether an attribution of a top surface of a component is a predetermined attribution value; and a three-dimensional-model creating unit that creates a three-dimensional model by applying a predetermined color to a top surface of a component of which the attribution of the top surface is determined to be the predetermined attribution value.

An apparatus according to still another aspect of the present invention is for creating a layout-model for a mechanical computer-aided design from component information including heights and layout information of components created by an electrical computer-aided design. The apparatus includes a height-definition determining unit that determines whether a height of a component is defined; and a three-dimensional-model creating unit that creates a three-dimensional model by applying a predetermined color to a component of which the height is determined to be undefined.

An apparatus according to still another aspect of the present invention is for creating a layout-model for a mechanical computer-aided design from component information including layout information of components created by an electrical computer-aided design. The apparatus includes a coordinate transforming unit that transforms coordinates of a component included in the component information based on an instruction from a user; and a three-dimensional-model creating unit that creates a three-dimensional model from component information with transformed coordinates of the component.

A method according to still another aspect of the present invention is for creating a layout-model for a mechanical computer-aided design from component information including heights and layout information of components created by an electrical computer-aided design. The method includes determining whether a height of a component is equal to or lower than a specified height; and creating a three-dimensional model by excluding a component of which the height is determined to be equal to or lower than the specified height.

A method according to still another aspect of the present invention is for creating a layout-model for a mechanical computer-aided design from component information including heights, attributions of top surfaces, and layout information of components created by an electrical computer-aided design. The method includes determining whether an attribution of a top surface of a component is a predetermined attribution value; and creating a three-dimensional model by adding a predetermined value to a height of a component of which the attribute of the top surface is determined to be the predetermined attribution value.

A method according to still another aspect of the present invention is for creating a layout-model for a mechanical computer-aided design from component information including attributions of top surfaces and layout information of components created by an electrical computer-aided design. The method includes determining whether an attribution of a top surface of a component is a predetermined attribution value; and creating a three-dimensional model by applying a predetermined color to a top surface of a component of which the attribution of the top surface is determined to be the predetermined attribution value.

A method according to still another aspect of the present invention is for creating a layout-model for a mechanical computer-aided design from component information including heights and layout information of components created by an electrical computer-aided design. The method includes determining whether a height of a component is defined; and creating a three-dimensional model by applying a predetermined color to a component of which the height is determined to be undefined.

A method according to still another aspect of the present invention is for creating a layout-model for a mechanical computer-aided design from component information including layout information of components created by an electrical computer-aided design. The method includes transforming coordinates of a component included in the component information based on an instruction from a user; and creating a three-dimensional model from component information with transformed coordinates of the component.

A computer-readable recording medium according to still another aspect of the present invention stores therein a computer program for creating a layout-model for a mechanical computer-aided design from component information including heights and layout information of components created by an electrical computer-aided design. The computer program causes a computer to execute determining whether a height of a component is equal to or lower than a specified height; and creating a three-dimensional model by excluding a component of which the height is determined to be equal to or lower than the specified height.

A computer-readable recording medium according to still another aspect of the present invention stores therein a computer program for creating a layout-model for a mechanical computer-aided design from component information including heights, attributions of top surfaces, and layout information of components created by an electrical computer-aided design. The computer program causes a computer to execute determining whether an attribution of a top surface of a component is a predetermined attribution value; and creating a three-dimensional model by adding a predetermined value to a height of a component of which the attribute of the top surface is determined to be the predetermined attribution value.

A computer-readable recording medium according to still another aspect of the present invention stores therein a computer program for creating a layout-model for a mechanical computer-aided design from component information including attributions of top surfaces and layout information of components created by an electrical computer-aided design. The computer program causes a computer to execute determining whether an attribution of a top surface of a component is a predetermined attribution value; and creating a three-dimensional model by applying a predetermined color to a top surface of a component of which the attribution of the top surface is determined to be the predetermined attribution value.

A computer-readable recording medium according to still another aspect of the present invention stores therein a computer program for creating a layout-model for a mechanical computer-aided design from component information including heights and layout information of components created by an electrical computer-aided design. The computer program causes a computer to execute determining whether a height of a component is defined; and creating a three-dimensional model by applying a predetermined color to a component of which the height is determined to be undefined.

A computer-readable recording medium according to still another aspect of the present invention stores therein a computer program for creating a layout-model for a mechanical computer-aided design from component information including layout information of components created by an electrical computer-aided design. The computer program causes a computer to execute transforming coordinates of a component included in the component information based on an instruction from a user; and creating a three-dimensional model from component information with transformed coordinates of the component.

A method of manufacturing a device, according to still another aspect of the present invention, includes creating a layout-model for a mechanical computer-aided design from component information including heights and layout information of components created by an electrical computer-aided design. The creating includes determining whether a height of a component is equal to or lower than a specified height, and creating a three-dimensional model by excluding a component of which the height is determined to be equal to or lower than the specified height.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention are described in detail below with reference to the accompanying drawings.

Figure 1:
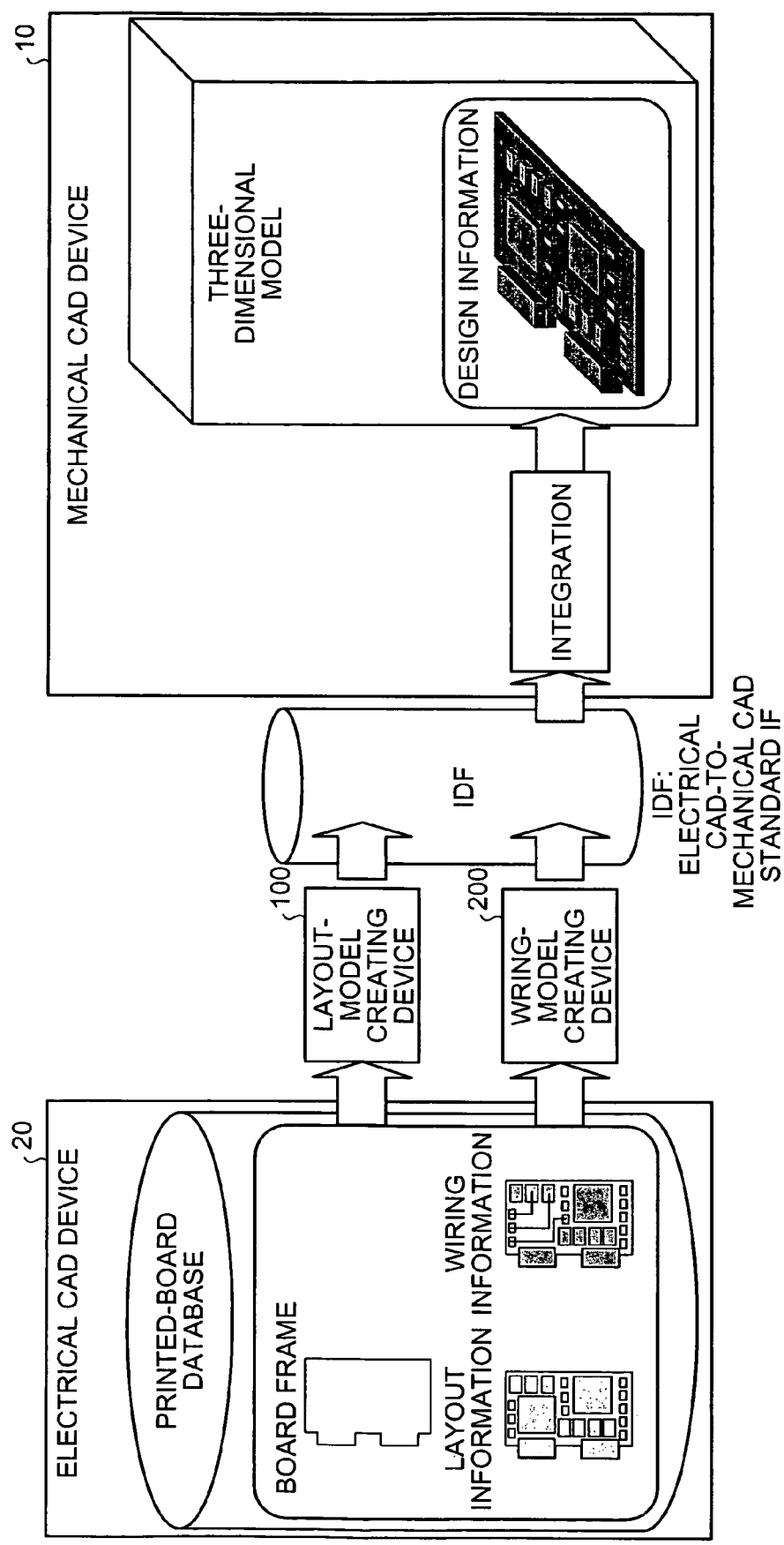
FIG. 1 is a schematic of a system in which an electrical CAD and a mechanical CAD interlock, according to an embodiment of the present invention.

FIG. 1 is a schematic of a system in which an electrical CAD and a mechanical CAD interlock, according to an embodiment of the present invention. As shown in FIG. 1, the system includes a mechanical CAD device 10, an electrical CAD device 20, a layout-model creating apparatus 100, and a wiring-model creating device 200.

The mechanical CAD device 10 aids in the mechanical designing by managing three-dimensional model data concerning, for example, a housing or a component of an information processing device. The electrical CAD device 20 aids in the electrical designing by managing information on a printed board or an electrical component.

The layout-model creating apparatus 100 is a device that aides the electrical CAD and the mechanical CAD to interlock. The layout-model creating apparatus 100 creates a layout model from information in a printed-board database created by the electrical CAD device 20, and outputs the layout model in an intermediate data format (IDF). The layout model is a three-dimensional model of a printed board with electrical components mounted thereon. The IDF is a file format that is used for exchanging information between the mechanical CAD and the electrical CAD. Although the IDF is employed as the file format that is used for exchanging information between the mechanical CAD and the electrical CAD, another file format can be employed.

The wiring-model creating device 200 is a device that aids the electrical CAD and the mechanical CAD to interlock. The wiring-model creating device creates a wiring model from the information in the printed-board database created by the electrical CAD device 20, and outputs the wiring model in the IDF. The wiring model is a three-dimensional model of a wiring pattern and a hole of the printed board.

The mechanical CAD device 10 integrates the layout model created by the layout-model creating apparatus 100 and the wiring model created by the wiring-model creating device 200 to use the integrated model in the mechanical designing. Details of the layout-model creating apparatus 100 and the wiring-model creating device 200 are described below.

Figure 2:
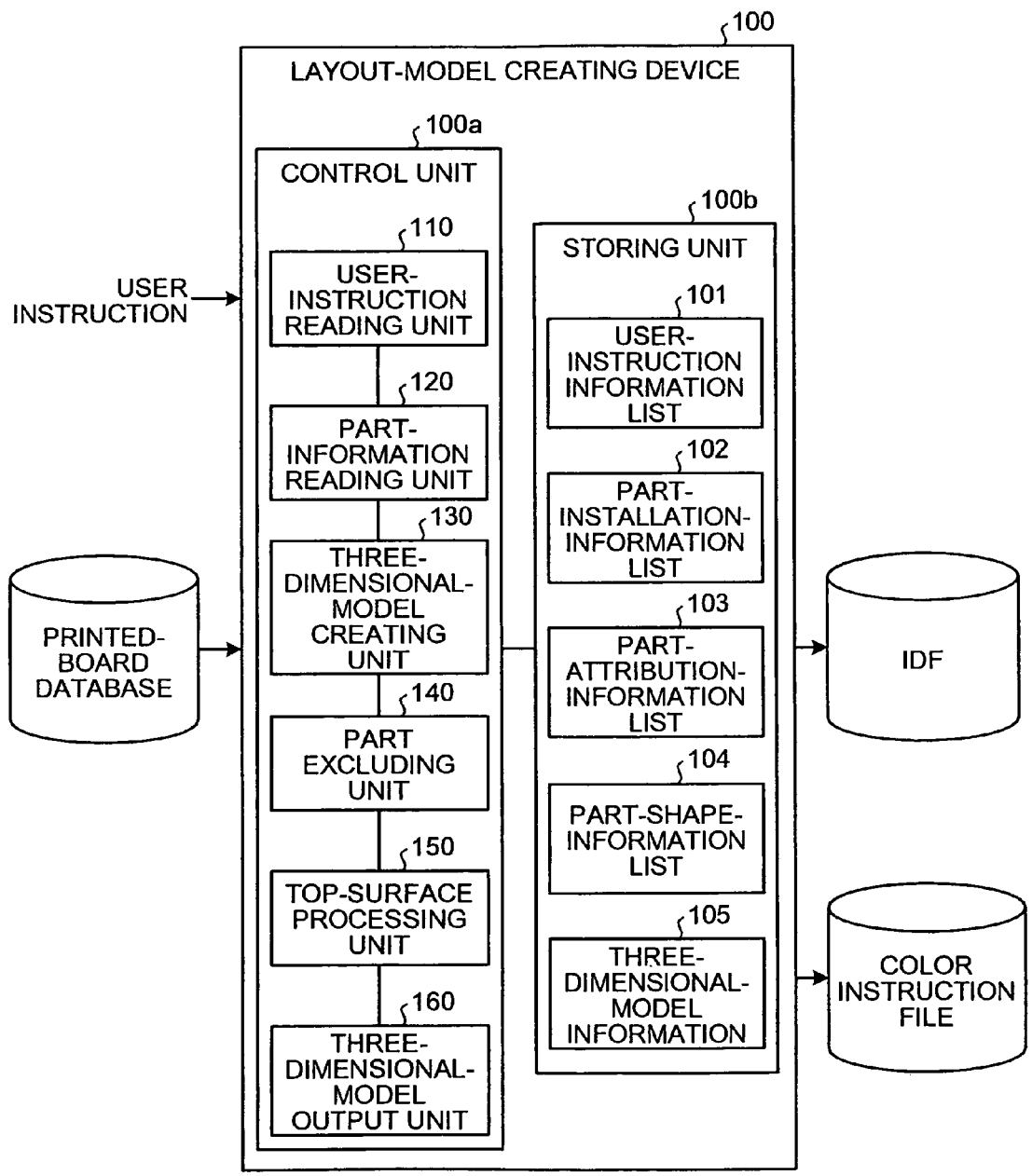
FIG. 2 is a functional block diagram of a layout-model creating apparatus.

FIG. 2 is a functional block diagram of the layout-model creating apparatus 100. As shown in FIG. 2, the layout-model creating apparatus 100 includes a control unit 100*a* that performs a process required to create the layout model and a storing unit 100*b* that stores information required to create the layout model therein.

The control unit 100*a* includes a user-instruction reading unit 110, a component-information reading unit 120, a three-dimensional model creating unit 130, a component excluding unit 140, a top-surface processing unit 150, and a three-dimensional-model output unit 160. The storing unit 100*b* stores therein user-instruction information 101, a component-installation-information list 102, a component-attribution-information list 103, a component-shape-information list 104, and three-dimensional-model information 105.

The user-instruction reading unit 110 is a processing unit that, in a process of creating the layout model, reads a user instruction and writes the instruction as the user-instruction information 101 to the storing unit 100*b*. The user instruction read by the user-instruction reading unit 110 includes layout information on the layout model (specifications with regard to coordinates transformation), the specified height for excluding a lower component from the layout model (a component equal to or lower than the specified height is excluded from the layout model), a value to be added to a height of a component with a non-insulated top surface, a color in which the component with the non-insulated top surface is painted, and an another color in which a component with an undefined height is painted.

The component-information reading unit 120 is a processing unit that reads the printed-board database created by the electrical CAD and writes the printed-board database to the storing unit 100*b* as the component-installation-information list 102, the component-attribution-information list 103, and the component-shape-information list 104. The component-installation-information list 102 includes an X-coordinate, a Y-coordinate, a surface, and an angle of each component, the component-attribution-information list 103 includes an insulation property, a heat resistance, and a height of each component, and the component-shape-information list 104 includes a shape of each component.

The three-dimensional-model creating unit 130 is a processing unit that creates a three-dimensional model of each component from the component-installation-information list 102 and the component-shape-information list 104 and writes the three-dimensional model as the three-dimensional-model information to the storing unit 100*b*.

Figure 3:
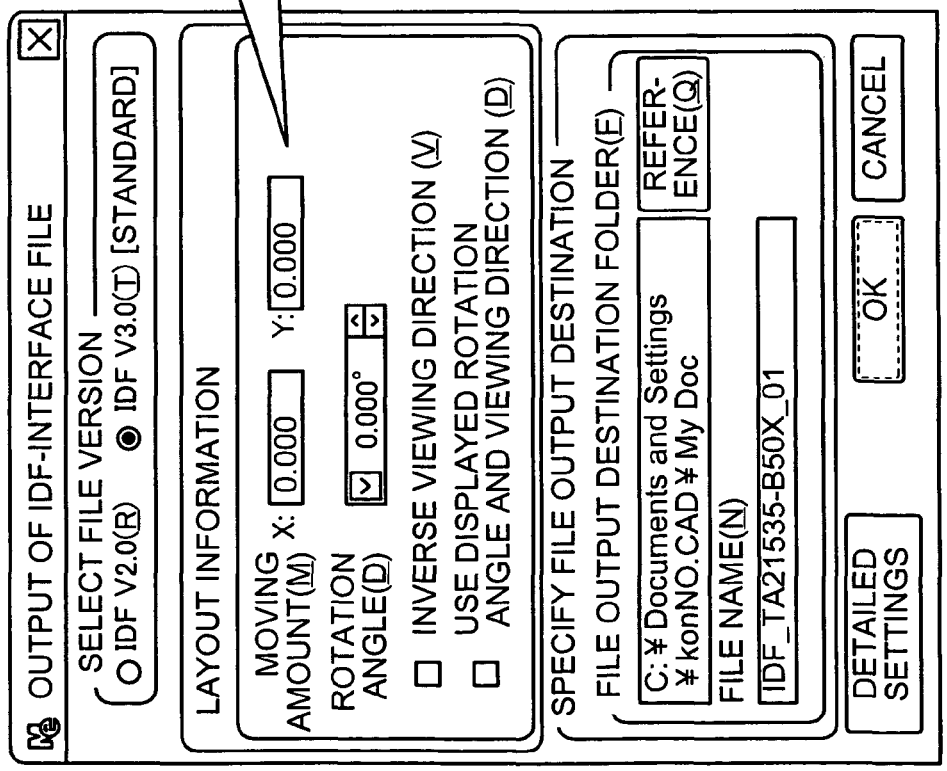
FIG. 3 is a schematic for explaining coordinates transformation by a three-dimensional-model creating unit.

When creating the three-dimensional model, the three-dimensional-model creating unit 130 performs coordinates transformation based on the layout information in the user-instruction information 101. FIG. 3 is a schematic for explaining the coordinates transformation performed by the three-dimensional-model creating unit 130. As shown in FIG. 3, it is possible for the user to specify parameters such as a moving amount in the X-axis, a moving amount in the Y-axis, a rotating angle of the printed board, and inversing a viewing direction as the layout information. The three-dimensional-model creating unit 130 performs the coordinates transformation based on the layout information specified by the user to create the three-dimensional model.

Because the three-dimensional-model creating unit 130 performs the coordinates transformation based on the layout information specified by the user to create the three-dimensional model, it is possible to use the three-dimensional model created by the electrical CAD in the mechanical CAD without the coordinates transformation, which reduces an amount of user work.

The component excluding unit 140 is a processing unit that excluding a component equal to or lower than the specified height in the user-instruction information 101 from the layout model. The component excluding unit 140 also paints the component with an undefined height in the specified color by referring the color specification in the user-instruction information 101. More specifically, the component excluding unit 140 outputs information such as a model name of the component with an undefined height and the specified color in which the component with an undefined height is painted to a color instruction file. The color instruction file is read by the mechanical CAD device 10. Because the component excluding unit 140 paints the component with an undefined height in the specified color, the component with an undefined height is highlighted.

The top-surface processing unit 150 is a processing unit that determines whether a top surface of a component is insulated and when the top surface is determined to be non-insulated adds the specified value to a height of the component with the non-insulated top surface. More specifically, the top-surface processing unit 150 changes the height of the component with the non-insulated top surface by correcting the three-dimensional-model information 105 in the storing unit 100b.

The top-surface processing unit 150 paints the component with the non-insulated top surface in the specified color by referring to the color specification in the user-instruction information 101. More specifically, the top-surface processing unit 150 outputs information such as a model name of the component with the non-insulated top surface and the specified color in which the component with the non-insulated top surface is painted to the color instruction file.

Figure 4:
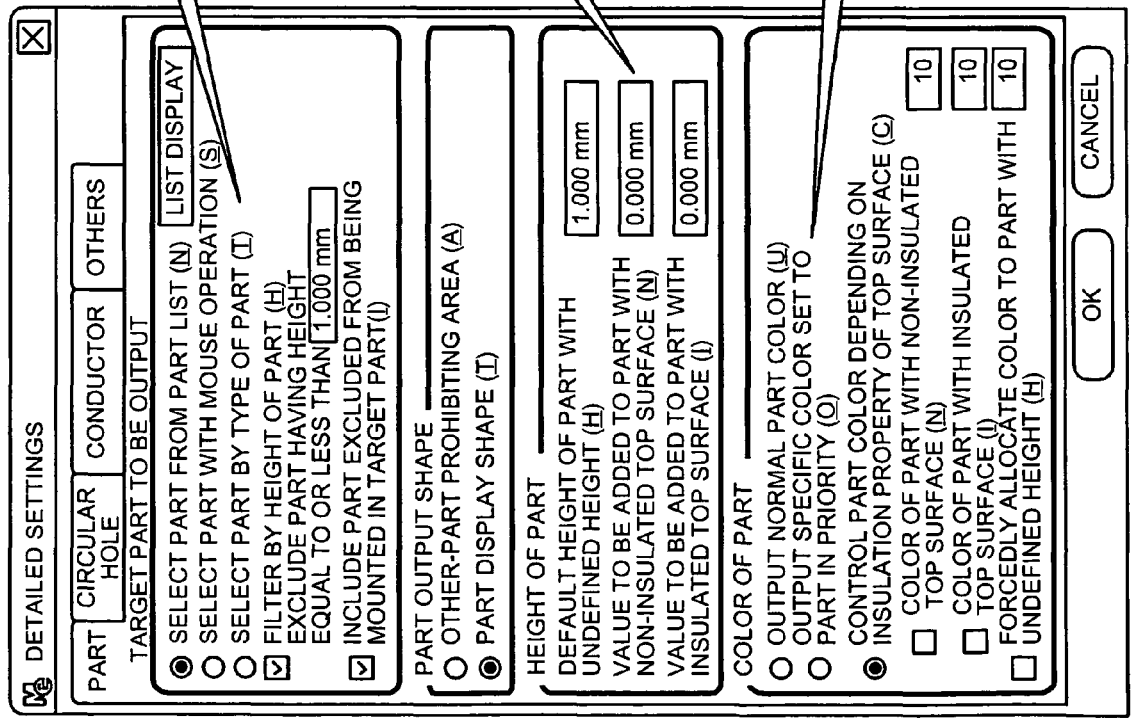
FIG. 4 is a schematic for explaining a process of a lower component performed by a component excluding unit and a process of a component with a non-insulated top surface performed by a top-surface processing unit.

FIG. 4 is a schematic for explaining a process of the lower component performed by the component excluding unit 140 and a process of the component with the non-insulated top surface performed by the top-surface processing unit 150. As shown in FIG. 4, because the component excluding unit 140 excludes the component equal to or lower than the height specified by the user from the layout model, the volume of the model of the printed board decreases and operability at the mechanical CAD improved.

As shown in FIG. 4, because the top-surface processing unit 150 adds the value specified by the user to the component with the non-insulated top surface, it is possible for the user to be free from cares about the insulated property of the components during operating the mechanical CAD and to easily verify the three-dimensional model with the mechanical CAD. Also, because the top-surface processing unit 150 paints the non-insulated top surface of the component in the color specified by the user, it is possible for the user to easily distinguish the non-insulated top-surface at the verification with mechanical CAD.

The three-dimensional-model output unit 160 is a processing unit that outputs the three-dimensional-model information 105 stored in the storing unit 100b in the IDF file.

Figure 5:
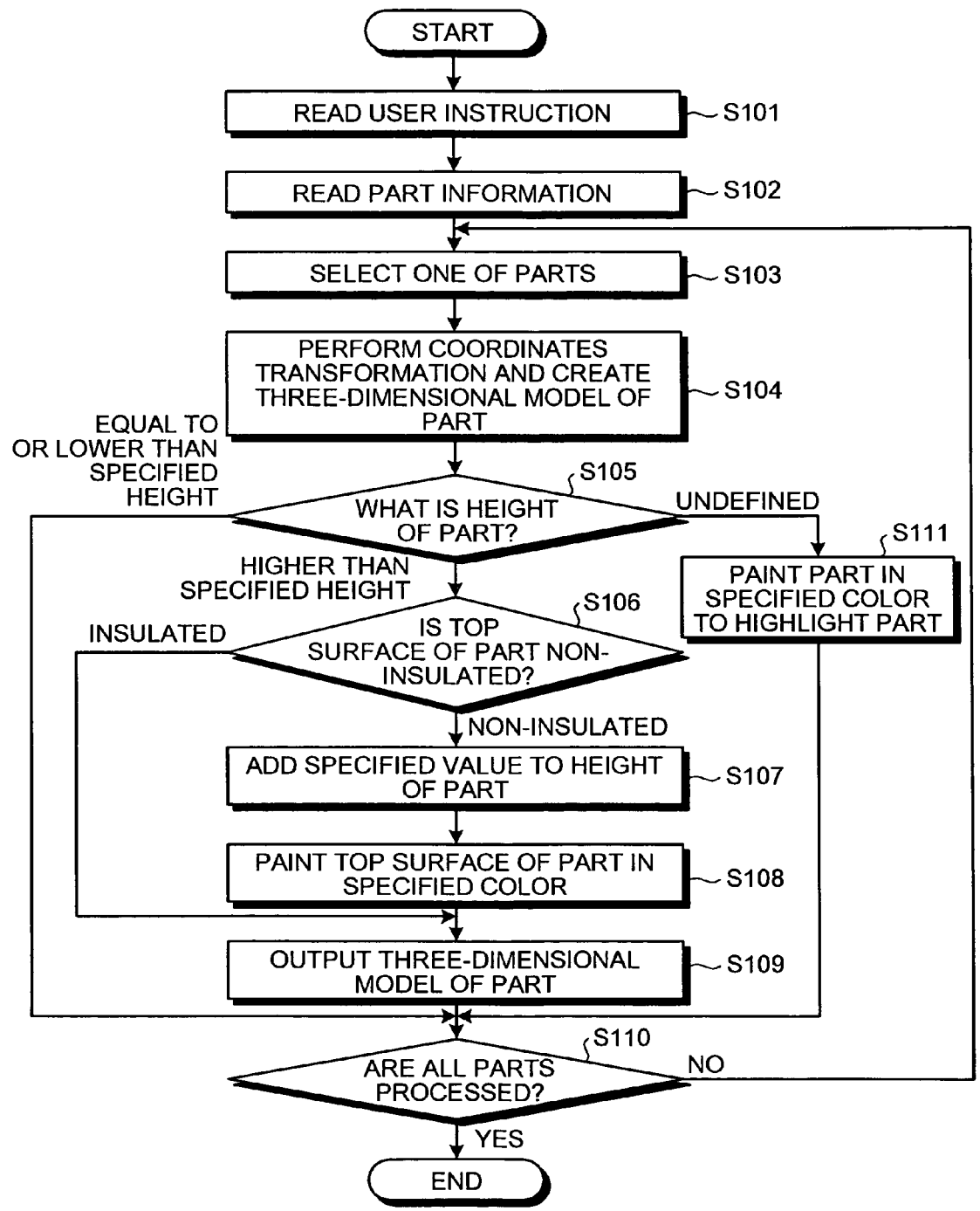
FIG. 5 is a flowchart of a procedure performed by the layout-model creating apparatus.

The procedure performed by the layout-model creating apparatus 100 is described below. FIG. 5 is a flowchart of the procedure performed by the layout-model creating apparatus 100. As shown in FIG. 5, in the layout-model creating apparatus 100, the user-instruction reading unit 110 reads a user instruction to write the instruction to the storing unit 100b as the user-instruction information 101 (step S101), and the component-information reading unit 120 reads the component information from the printed-board database to write the information to the storing unit 100b as the component-installation-information list 102, the component-attribution-information list 103, and the component-shape-information list 104 (step S102).

The three-dimensional-model creating unit 130 selects one of the components (step S103), performs the coordinates transformation based on the layout information included in the user-instruction information 101, creates a three-dimensional model of the selected component while, and writes the created three-dimensional model to the storing unit 100b as the three-dimensional-model information 105 (step S104).

The component excluding unit 140 determines whether the component has a defined height. When the height is undefined (the height is undefined at step S105), the component excluding unit 140 paints the component in the specified color by referring to the color specification in the user-instruction information 101 (step S111). When the height is defined (defined at step S105), the component excluding unit 140 compares the height of the component with the specified height. When the height of the component is equal to or lower than the specified height (equal to or lower than the specified height, at step S105), the component is excluded from target objects to be modeled in three-dimensional and the process goes to step S110.

When the height of the component is higher than the specified height (higher than the specified height, at step S105), the component is included in the target objects. The top-surface processing unit 150 determines whether a top surface of the component included in the target objects is insulated (step S106). When the top surface is non-insulated, the top-surface processing unit 150 adds the specified value in the user-instruction information 101 (the user can set the specified value to zero) to the height of the component with the non-insulated top surface (step S107), and paints the top surface of the component in the specified color (step S108). When the user does not specify the color in which the non-insulated top surface is painted, the top-surface processing unit 150 does not paint the non-insulated top surface.

The three-dimensional-model output unit 160 outputs the three-dimensional-model information 105 in the IDF file (step S109), and determines whether all of the components is processed by the three-dimensional-model creating unit 130 (step S110). When there is an unprocessed component, the process goes to step S103 to select a next component. When all components are processed, the process ends.

As described above, in the process of creating the layout model, the layout-model creating apparatus 100 performs the coordinates transformation, paints the specified color on the component with an undefined height, excludes the lower component, adds the specified value to the height of the component with the non-insulated top surface, and paints the component with the non-insulated top surface in the specified color, which makes the created layout model easy to be used with the mechanical CAD.

Figure 6:
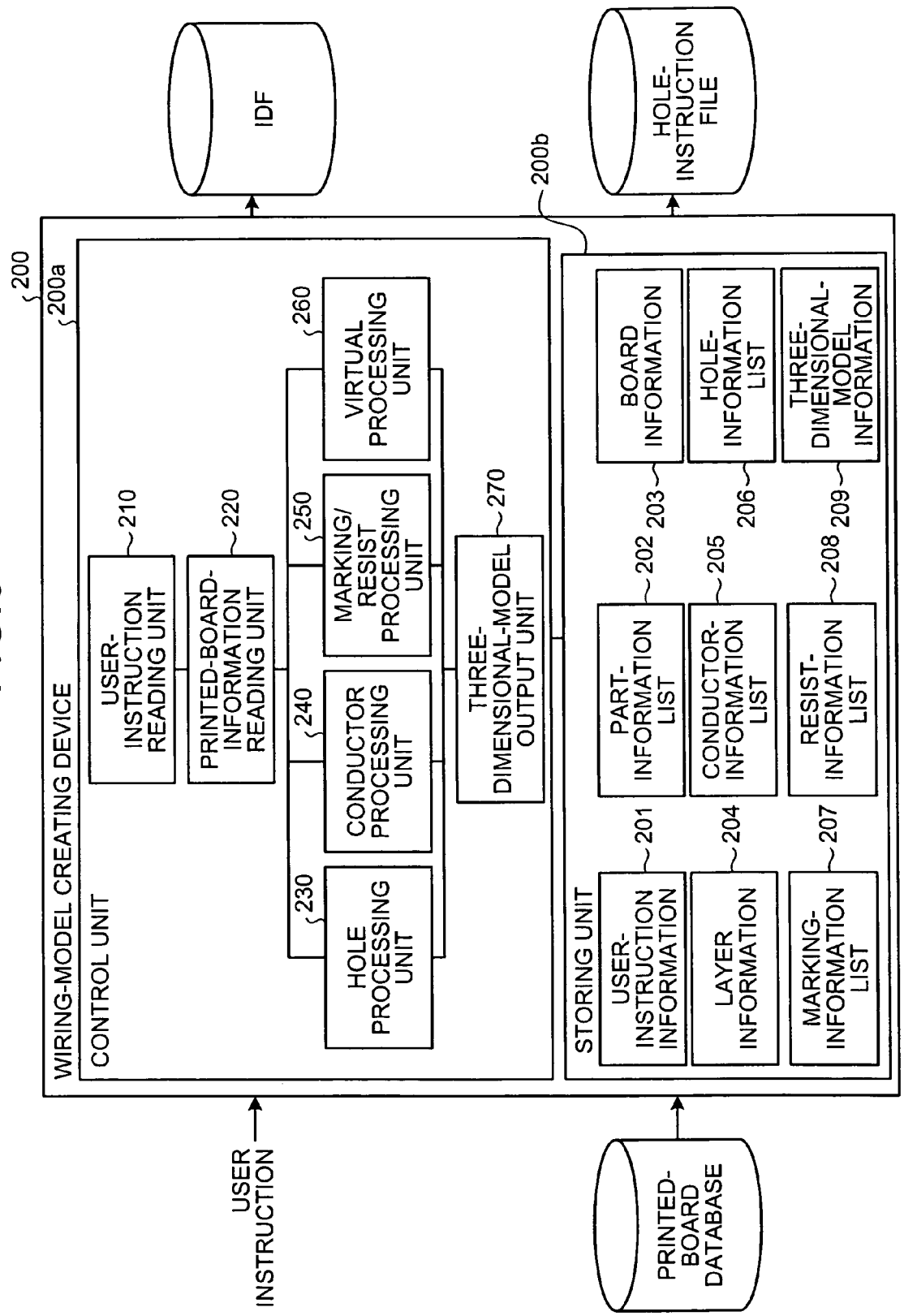
FIG. 6 is a functional block diagram of a wiring-model creating device.

FIG. 6 is a functional block diagram of the wiring-model creating device 200. As shown in FIG. 6, the wiring-model creating device 200 includes a control unit 200a that performs a process required to create the wiring model and a storing unit 200b that stores information required to create the wiring model therein.

The control unit 200a includes a user-instruction reading unit 210, a printed-board-information reading unit 220, a hole processing unit 230, a conductor processing unit 240, a marking/resist processing unit 250, a virtual processing unit 260, and a three-dimensional-model output unit 270.

The storing unit 200b stores therein user-instruction information 201, a component-information list 202, board information 203, layer information 204, a conductor-information list 205, a hole-information list 206, a marking-information list 207, a resist-information list 208, and three-dimensional-model information 209.

The user-instruction reading unit 210 is a processing unit that, in the process of creating the wiring model, reads a user instruction and writes the user instruction to the storing unit 200b as the user-instruction information 201. The user instruction read by the user-instruction reading unit 210 includes instructions such as specifying target objects to be modeled in three-dimensional from the components in the printed board, merging wired lines and component pins, and suppressing an output of the cutting-out shapes in a surface pattern.

The printed-board-information reading unit 220 is a processing unit that reads the printed-board database created by the electrical CAD and writes the printed-board database to the storing unit 200b as the component-information list 202, the board information 203, the layer information 204, the conductor-information list 205, the hole-information list 206, the marking-information list 207, and the resist-information list 208.

The component-information list 202 includes installation information of each component such as an X-coordinate, a Y-coordinate, a surface, and an angle and an X-coordinate and a Y-coordinate of each component pin. The board information 203 includes a thickness of each layer of the board and an insulated layer. The layer information 204 includes an attribution of each layer. The conductor-information list 205 includes information on a wired line such as coordinates of a start point and an end point, a width and a layer to be placed, information on a surface pattern such as coordinates of a vertex and a layer to be placed, and information on a text such as a height and a layer to be placed. The hole-information list 206 includes in an X-coordinate, a Y-coordinate, and a drilled diameter of a hole. The marking-information list 207 includes a figure or a text to be marked. The resist-information list 208 includes a resist area and a resist-forbidden information.

The hole processing unit 230 is a processing unit that creates a three-dimensional model of a hole in a board land or for a component terminal and writes information on the created three-dimensional model to the storing unit 200b as the three-dimensional-model information 209. The hole to be created in three-dimensional is specified by the user and stored in the storing unit 200b as the user-instruction information 201. The hole processing unit 230 excludes a hole with a drilled diameter smaller than a diameter specified by the user from the target objects, which reduces a volume of the created three-dimensional model.

Figure 7:
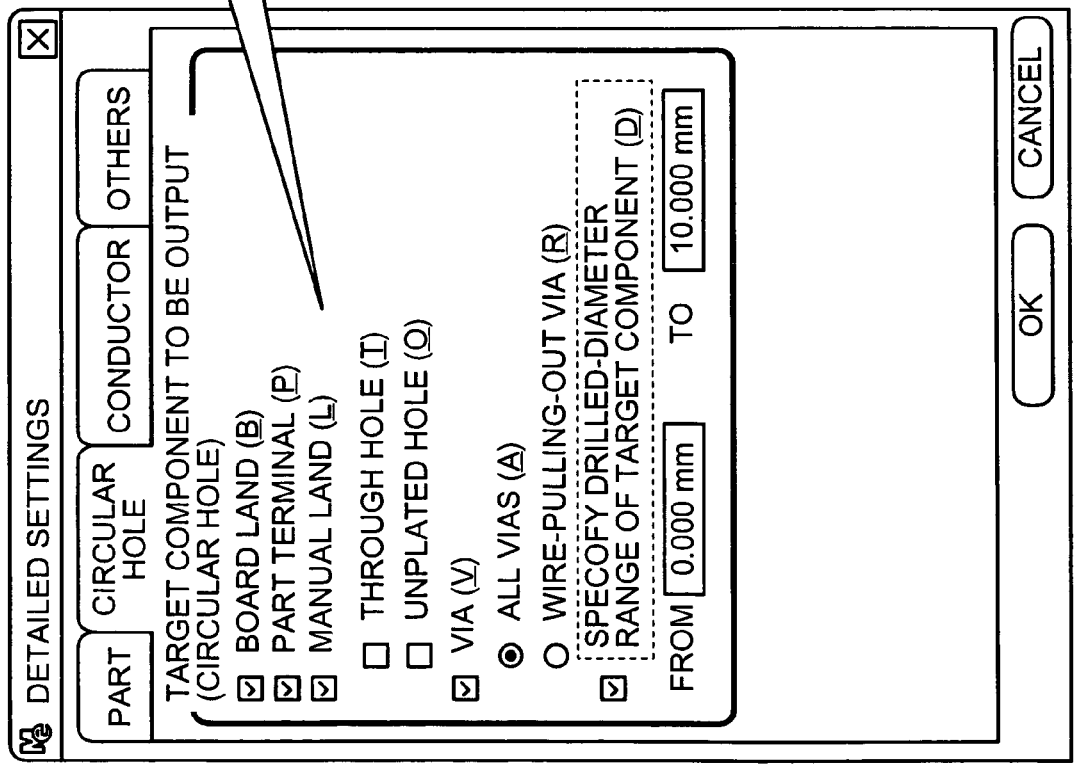
FIG. 7 is a schematic for explaining an example of a user screen for specifying a hole-output property.

FIG. 7 is a schematic for explaining an example of a user screen for specifying a hole-output property. As shown in FIG. 7, it is possible for the user to specify the target objects from the board land, the component terminal, a manual land, and a via. It is also possible for the user to specify a drilled diameter of the hole to be created in three-dimensional.

Figure 8:
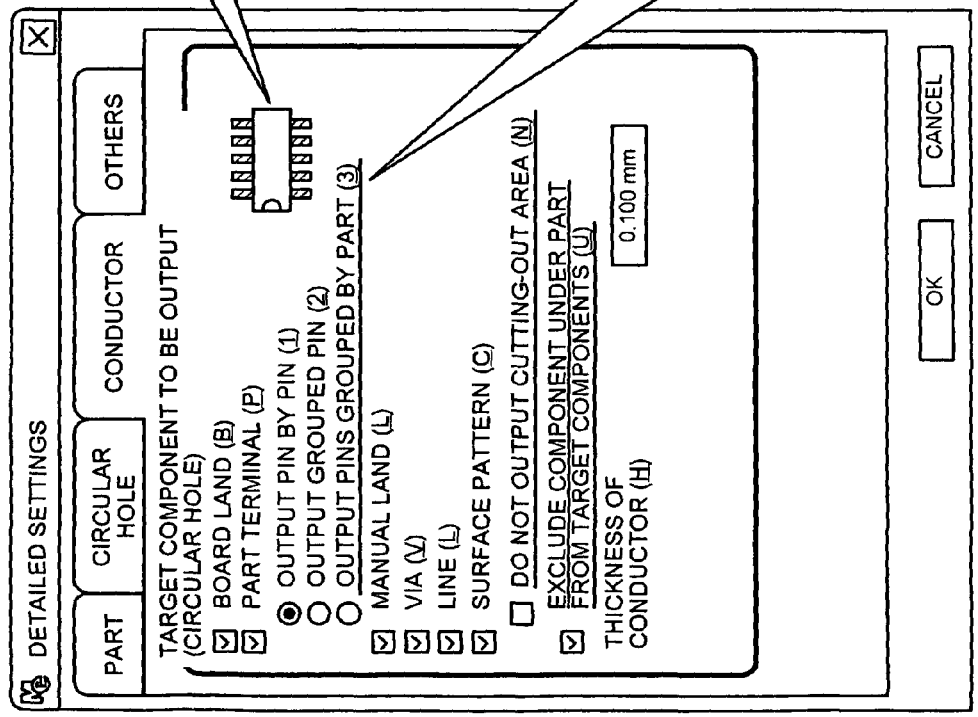
FIG. 8 is a schematic for explaining an example of a user screen for specifying a conductor.

The conductor processing unit 240 is a processing unit that creates a three-dimensional model of a conductor such as a component terminal (a pin), a wired line, a surface pattern, a land/via, or a text as a wiring pattern and writes information on the created three-dimensional model to the storing unit 200b as the three-dimensional-model information 209. The conductor to be created in three-dimensional is specified by the user. FIG. 8 is a schematic for explaining an example of a user screen for specifying the conductor to be created in three-dimensional. As shown in FIG. 8, it is possible for the user to specify the conductor to be created in three-dimensional from ones placed on a surface of the printed board.

If each of the pins is created in three-dimensional, the volume of the created three-dimensional model can become large. To avoid the enlargement, it is possible for the user to direct the conductor processing unit 240 to create a single model of a plurality of pins for each component. The user specifies the modeling of the pins by component through the user screen shown in FIG. 8.

If each of the wired lines is created in three-dimensional, the volume of the created three-dimensional model becomes large. To avoid the enlargement, it is possible for the user to specify merging of the wired lines. Upon receiving the merging, the conductor processing unit 240 traces the wired lines for each component pin and creates a single model of the wired lines.

When creating a three-dimensional model of the surface pattern, if all cutting-out shapes in the surface pattern is modeled, the volume of the three-dimensional model becomes large. Therefore, when a user issues an instruction for suppressing an output of the cutting-out shapes, the conductor processing unit 240 performs a modeling as a model of an outer frame of the surface pattern alone. The user can specify whether to suppress the output of the cutting-out shapes, through the user screen shown in FIG. 8.

When creating the user issues an instruction for excluding conductors under the components and the surface pattern from the target objects, the conductor processing unit 240 recognizes the conductors under the components and the surface pattern not present. The user can specify whether to output the conductor under the components and the surface pattern, through the user screen shown in FIG. 8.

The marking/resist processing unit 250 is a processing unit that create a three-dimensional model of a marking/resist and writes information on the created three-dimensional model to the storing unit 200b as the three-dimensional-model information 209.

Figure 9:
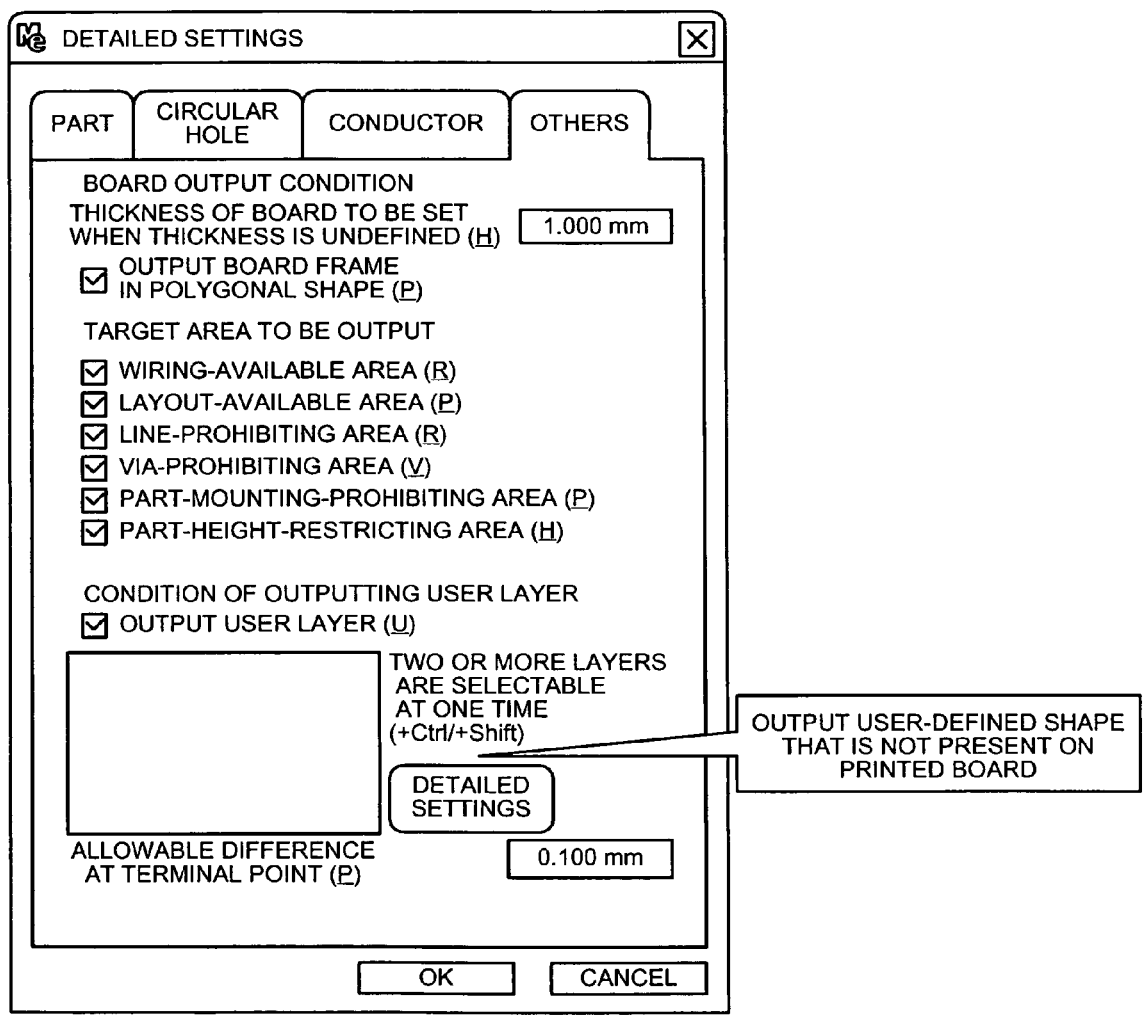
FIG. 9 is a schematic for explaining an example of a user screen for specifying a virtual object.

The virtual processing unit 260 is a processing unit that creates a three-dimensional model of a virtual object that isn't present on the printed board for an evaluation at the mechanical CAD, and that writes information on the created three-dimensional model to the storing unit 200b as the three-dimensional-model information 209. A virtual object to be created in three-dimensional is specified by the user. FIG. 9 is a schematic for explaining an example of a user screen for specifying the virtual object. As shown in FIG. 9, to specify the virtual object to be created in three-dimensional, the user specifies a drawing at "conditions for outputting a user layer". A component for preventing the printed board from a vertical deviation and a cooling component are regarded as the virtual objects.

The three-dimensional-model output unit 270 is a processing unit that outputs the three-dimensional-model information 209 stored in the storing unit 200b in the IDF file. The three-dimensional-model output unit 270 separately outputs the information on three-dimensional model of holes including a model name, a position, and a diameter in a hole-instruction file. The hole-instruction file is read by the mechanical CAD device 10.

Figure 10:
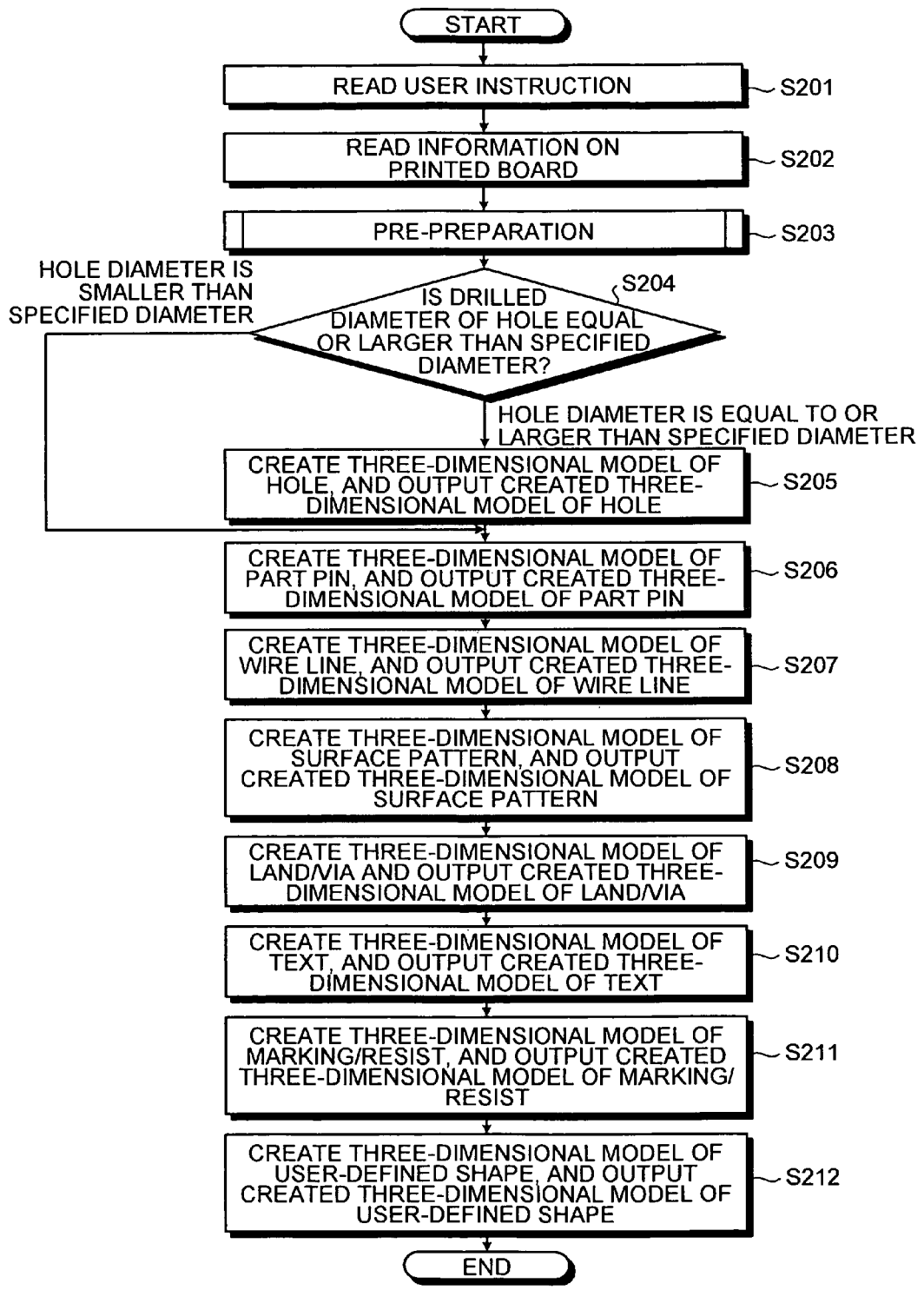
FIG. 10 is a flowchart of a procedure performed by the wiring-model creating unit.

FIG. 10 is a flowchart of the procedure performed by the wiring-model creating device 200. As shown in FIG. 10, in the wiring-model creating device 200, the user-instruction reading unit 210 reads an user instruction to write the user instruction to the storing unit 200b as the user-instruction information 201 (step S201), the printed-board-information reading unit 220 reads information on the printed board from the printed-board database to write the information on the printed board to the storing unit 200b as the component-information list 202, the board information 203, the layer information 204, the conductor-information list 205, the hole-information list 206, the marking-information list 207, and the resist-information list 208 (step S202).

The conductor processing unit 240 performs pre-preparations such as merging of the lines or merging of the component pins (step S203). The hole processing unit 230 determines whether a drilled diameter of a hole is equal to or larger than the specified diameter (step S204). When the dilled diameter is equal to or larger than the specified diameter, the hole processing unit 230 creates a three-dimensional model of the hole and the three-dimensional-model output unit 270 outputs the three-dimensional model created by the hole processing unit 230 in the IDF file (step S205). When the dilled diameter is smaller than the specified diameter, the hole is excluded from the target objects and the three-dimensional model of the hold is not created.

The conductor processing unit 240 creates a three-dimensional model of each conductor in the conductor-information list 205, i.e., the terminal, the wired line, the surface pattern, the land/via, and the text), and the three-dimensional-model output unit 270 outputs the three-dimensional model created by the conductor processing unit 240 in the IDF file (steps from S206 to S210).

The marking/resist processing unit 250 creates a three-dimensional model of the marking/resist, and the three-dimensional-model output unit 270 outputs the three-dimensional model created by the marking/resist processing unit 250 in the IDF file (step S211).

The virtual processing unit 260 creates a three-dimensional model of a virtual object specified by the user, and the three-dimensional-model output unit 270 outputs the three-dimensional model created by the virtual processing unit 260 in an IDF file (step S212).

As described above, by creating the three-dimensional models of the hole, the conductor, the marking/resist, and the virtual object of the printed board, the created wiring model becomes accurate.

Figure 11:
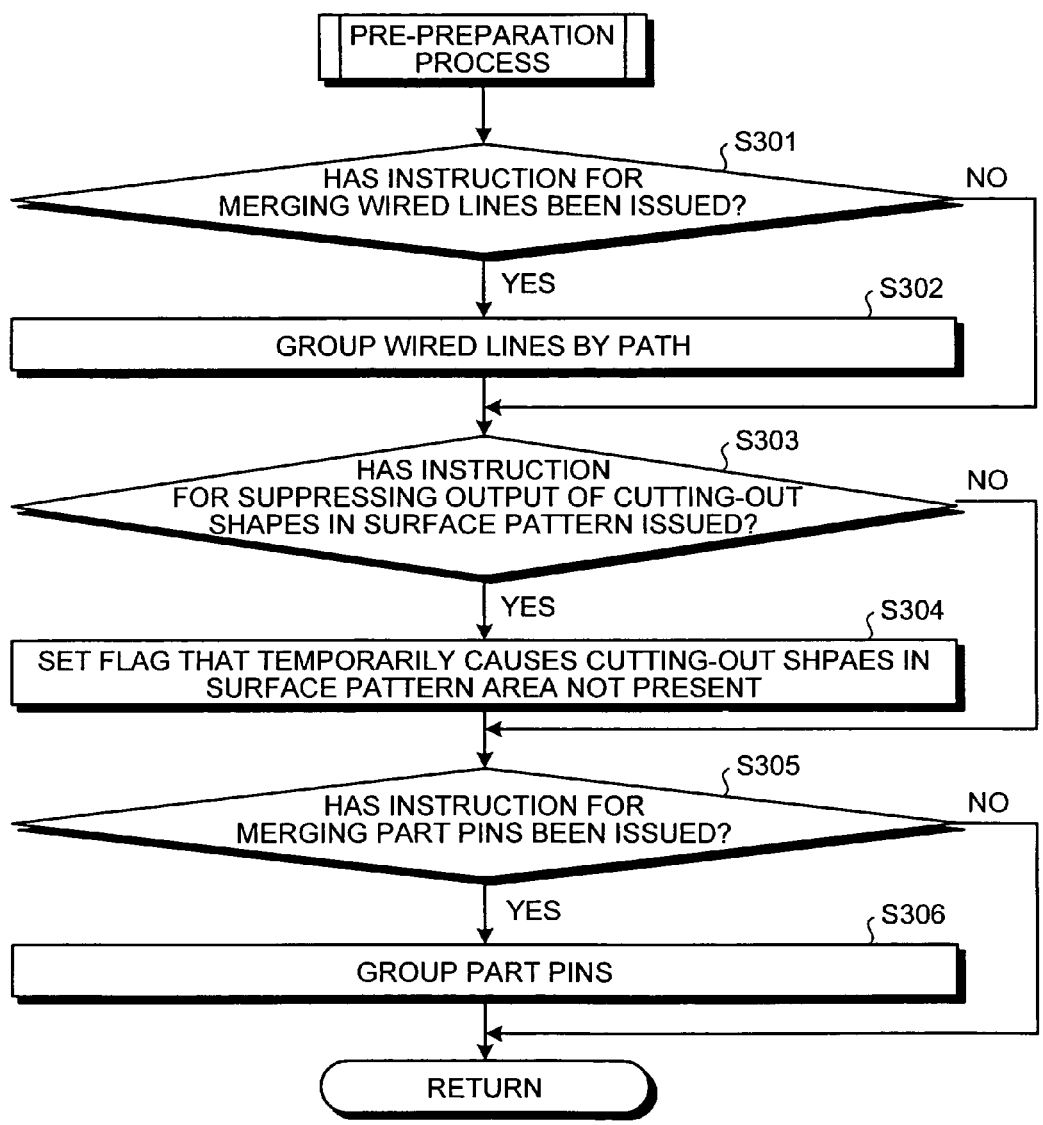
FIG. 11 is a flowchart of a procedure at pre-preparation shown in FIG. 10.

FIG. 11 is a flowchart of the procedure at the pre-preparation shown in FIG. 10. As shown in FIG. 11, the conductor processing unit 240 determines whether an instruction for merging the wired lines has been issued by referring to the user-instruction information 201 (step S301). When the instruction for merging the wired lines has been issued, the conductor processing unit 240 groups the wired lines by path (step S302), and changes the data in the conductor-information list 205.

The conductor processing unit 240 determines whether an instruction for an output of the cutting-out shapes in surface pattern has been issued by referring to the user-instruction information 201 (step S303). When the instruction for the output of the cutting-out shapes in the surface pattern has been issued, the conductor processing unit 240 sets a flag that temporarily causes the cutting-out shapes in the surface pattern not present (step S304). At step S208 shown in FIG. 10, the conductor processing unit 240 creates the three-dimensional model of the surface pattern by referring to the flag set at the pre-preparation.

The conductor processing unit 240 determines whether an instruction for merging the component pins has been issued by referring to the user-instruction information 201 (step S305). When the instruction for merging the component pins has been issued, the conductor processing unit 240 groups the component pins (step S306) and changes the data in the conductor-information list 205.

Because the conductor processing unit 240 groups the wired lines and the component pins and suppressing the output of the cutting-out shapes in the surface pattern, the volume of the created three-dimensional model becomes lighten.

According to the embodiment, in the process in which the layout-model creating apparatus 100 creates the layout model from the component information created by the electrical CAD, the three-dimensional-model creating unit 130 performs the coordinates transformation as the user has specified, the component excluding unit 140 paints the component with an undefined height in the specified color and excludes the component with a height lower than the height specified by the user from the target objects, and the top-surface processing unit 150 sets the height of the component with the non-insulated top surface higher than the actual or paints the non-insulated top surface in the color specified by the user. As a result, it is possible to create the layout model that is easy to be used with the mechanical CAD.

Furthermore, according to the embodiment, the wiring-model creating device 200 creates the wiring model compatible with the mechanical CAD from the information on the holes and the conductors on the printed board created by the electrical CAD, which allows the user to perform the mechanical designing while checking the information on the wiring on the printed board with the mechanical CAD.

Moreover, according to the embodiment, in the process of creating the wiring model by the wiring-model creating device 200, according to the user instruction, the hole processing unit 230 excludes the hole with the diameter smaller than the diameter specified by the user from the target objects, the conductor processing unit 240 groups the wired lines or the component pins to create the three-dimensional model of the grouped wired lines or the grouped component pins, and the conductor processing unit 240 excludes the cutting-out shapes in the surface pattern and the conductors under the components or the surface pattern from the target objects, which makes it possible to reduce the volume of the three-dimensional model.

Furthermore, according to the embodiment, in the process of creating the wiring model by the wiring-model creating device 200, according to the user instruction, the virtual processing unit 260 creates the three-dimensional model of the virtual object that isn't present on the printed board, which makes it possible to create the wiring model including the three-dimensional model for aiding in the evaluation at mechanical CAD.

Although the layout-model creating apparatus 100 and the wiring-model creating device 200 are described in the embodiment, it is possible to create the layout-model creating program and the wiring-model creating program with similar functions by implementing the configurations of the layout-model creating apparatus 100 and the wiring-model creating device 200 in software. A computer that executes the layout-model creating program is described below. The wiring-model creating model can be executed by the similar computer.

Figure 12:
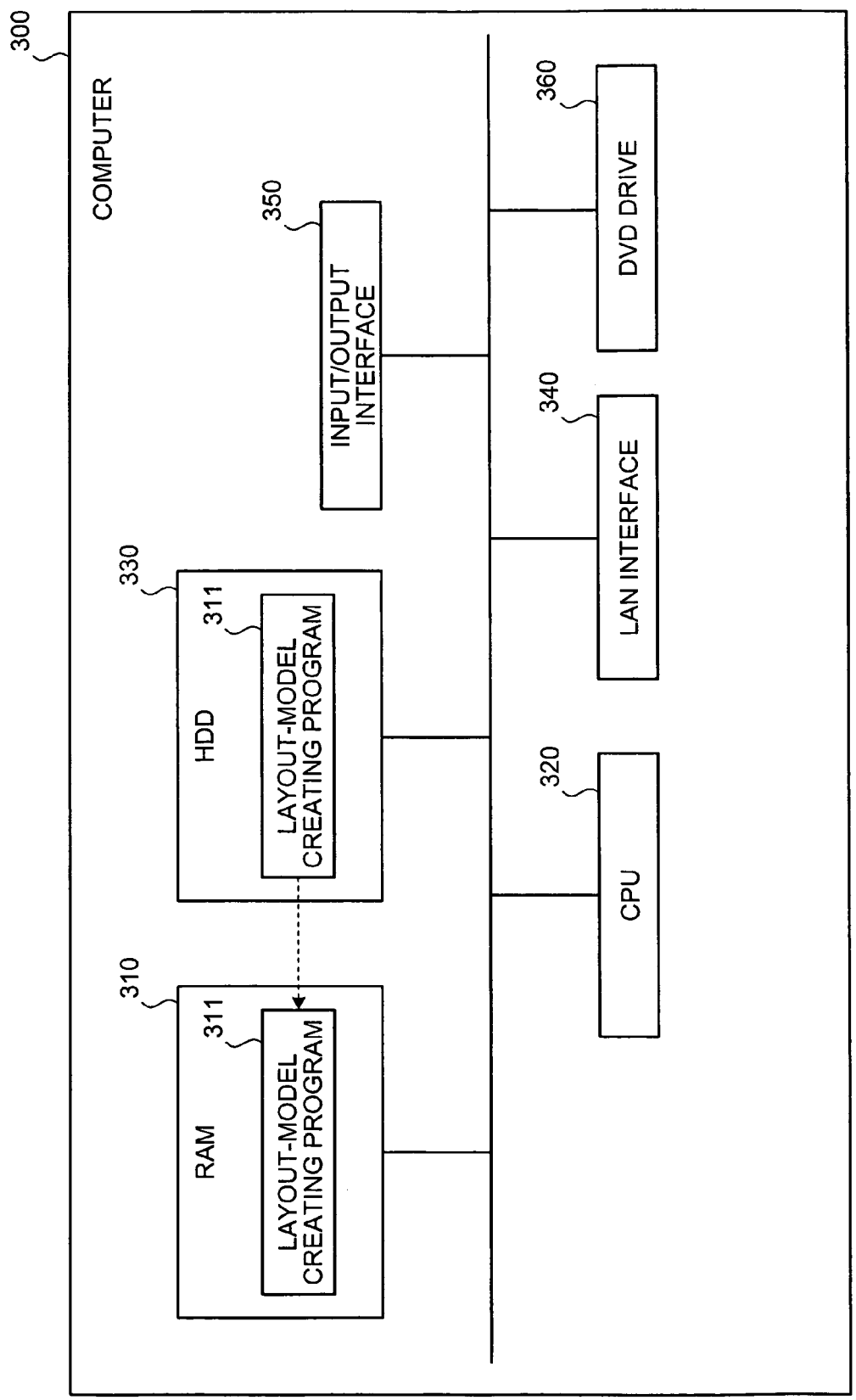
FIG. 12 is a functional block diagram of a computer that executes a layout-model creating program according to the present embodiment.

FIG. 12 is a functional block diagram of a computer 300 that executes the layout-model creating program according to the embodiment of the present invention. As shown in FIG. 12, the computer 300 includes a random access memory (RAM) 310, a central processing unit (CPU) 320, a hard disk drive (HDD) 330, a local area network (LAN) interface 340, an input/output interface 350, and a digital versatile disk (DVD) drive 360.

The RAM 310 stores a program or an interval result of the program therein. The CPU 320 reads the program from the RAM 310 to execute the read program. The HDD 330 stores a program or data therein. The LAN interface 340 is used for connecting the computer 300 to another computer via a LAN. The input/output interface 350 is used for connecting an input device, such as a mouse or a keyboard, or a display device to the computer 300. The DVD drive 360 reads or writes from or to a DVD.

A layout-model creating program 311 executed by the computer 300 is stored in the DVD, and is read from the DVD by the DVD drive 360 to be installed on the computer 300. It is allowable that the layout-model creating program 311 is stored in a database in the other computer connected to the computer 300 via the LAN interface 340, and is read from the database to be installed on the computer 300. The layout-model creating program 311 is stored in the HDD 330, and is loaded to the RAM 310 to be executed by the CPU 320.

Although the layout-model creating apparatus 100 and the wiring-model creating device 200 are described as independent devices from the mechanical CAD device 10 and the electrical CAD device 20 according to the embodiment, the functions of the layout-model creating apparatus 100 and the wiring-model creating device 200 can be included in the mechanical CAD device 10 and the electrical CAD device 20. It is also allowable to employ an integrated device that aids the electrical CAD and the mechanical CAD to interlock with the functions of both the layout-model creating apparatus 100 and the wiring-model creating device 200.

As describe above, according to an embodiment of the present invention, it is possible to obtain an effect of reducing a volume of a layout model by reducing the number of components in a three-dimensional model.

Furthermore, according to an embodiment of the present invention, because a designer can perform the mechanical designing free from cares about an attribution of a top-surface of the component, it is possible to obtain an effect of improving efficiency in the designing.

Moreover, according to an embodiment of the present invention, because the designer performs the mechanical designing free from cares about a non-insulated property of the top surface of the component, it is possible to obtain an effect of improving efficiency in the designing.

Furthermore, according to an embodiment of the present invention, because the designer performs the mechanical designing as paying attention to the attribution of the top surface of the component, it is possible to obtain an effect of improving quality in the designing.

Moreover, according to an embodiment of the present invention, because the designer performs the mechanical designing as noticing that the top surface of the component is non-insulated, it is possible to obtain an effect of improving quality in the designing.

Furthermore, according to an embodiment of the present invention, because the designer performs the mechanical designing as noticing that the height of the component is undefined, it is possible to obtain an effect of improving quality in the designing.

Moreover, according to an embodiment of the present invention, because work by the designer decreases by skipping coordinates transformation, it is possible to obtain an effect of improving efficiency in the designing.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. An apparatus for creating a layout-model for a mechanical computer-aided design from component information including heights, attributions of top surfaces, and layout information of components created by an electrical computer-aided design, the apparatus comprising:
    an attribution determining unit that determines whether an attribution of a top surface of a component is a predetermined attribution value; and
    a three-dimensional-model creating unit that creates a three-dimensional model by adding a predetermined value to a height of a component of which the attribution of the top surface is determined to be the predetermined attribution value, wherein
    the attribution of the top surface is an electrical insulation, and
    the three-dimensional-model creating unit creates the three-dimensional model by adding the predetermined value to the height of the component of which the top surface is determined to be non-insulated.

2. An apparatus for creating a layout-model for a mechanical computer-aided design from component information including attributions of top surfaces and layout information of components created by an electrical computer-aided design, the apparatus comprising:
    an attribution determining unit that determines whether an attribution of a top surface of a component is a predetermined attribution value; and
    a three-dimensional-model creating unit that creates a three-dimensional model by applying a predetermined color to a top surface of a component of which the attribution of the top surface is determined to be the predetermined attribution value, wherein
    the attribution of the top surface is an electrical insulation, and
    the three-dimensional-model creating unit creates the three-dimensional model by applying the predetermined color to the top surface of the component of which the top surface is determined to be non-insulated.

3. A method of creating a layout-model for a mechanical computer-aided design from component information including heights, attributions of top surfaces, and layout information of components created by an electrical computer-aided design, the method comprising:
    determining whether an attribution of a top surface of a component is a predetermined attribution value; and
    creating, using a central processing unit of a computer, a three-dimensional model by adding a predetermined value to a height of a component of which the attribution of the top surface is determined to be the predetermined attribution value, wherein
    the attribution of the top surface is an electrical insulation, and
    the creating creates the three-dimensional model by adding the predetermined value to the height of the component of which the top surface is determined to be non-insulated.

4. A method of creating a layout-model for a mechanical computer-aided design from component information including attributions of top surfaces and layout information of components created by an electrical computer-aided design, the method comprising:
    determining whether an attribution of a top surface of a component is a predetermined attribution value; and
    creating, using a central processing unit of a computer, a three-dimensional model by applying a predetermined color to a top surface of a component of which the attribution of the top surface is determined to be the predetermined attribution value, wherein
    the attribution of the top surface is an electrical insulation, and
    the creating creates the three-dimensional model by applying the predetermined color to the top surface of the component of which the top surface is determined to be non-insulated.

5. A computer-readable recording medium that stores therein a computer program for creating a layout-model for a mechanical computer-aided design from component information including heights, attributions of top surfaces, and layout information of components created by an electrical computer-aided design, wherein the computer program causes a computer to execute:

determining whether an attribution of a top surface of a component is a predetermined attribution value; and creating a three-dimensional model by adding a predetermined value to a height of a component of which the attribution of the top surface is determined to be the predetermined attribution value, wherein the attribution of the top surface is an electrical insulation, and the creating creates the three-dimensional model by adding the predetermined value to the height of the component of which the top surface is determined to be non-insulated.

6. A computer-readable recording medium that stores therein a computer program for creating a layout-model for a mechanical computer-aided design from component information including attributions of top surfaces and layout information of components created by an electrical computer-aided design, wherein the computer program causes a computer to execute:

determining whether an attribution of a top surface of a component is a predetermined attribution value; and creating a three-dimensional model by applying a predetermined color to a top surface of a component of which the attribution of the top surface is determined to be the predetermined attribution value, wherein the attribution of the top surface is an electrical insulation, and the creating creates the three-dimensional model by applying the predetermined color to the top surface of the component of which the top surface is determined to be non-insulated.

* * * * *